(12) United States Patent
Umebayashi

(10) Patent No.: US 7,087,956 B2
(45) Date of Patent: Aug. 8, 2006

(54) SEMICONDUCTOR DEVICE AND IT'S MANUFACTURING METHOD

(75) Inventor: Taku Umebayashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/203,776

(22) PCT Filed: Dec. 13, 2001

(86) PCT No.: PCT/JP01/10946

§ 371 (c)(1),
(2), (4) Date: Aug. 13, 2002

(87) PCT Pub. No.: WO02/49112

PCT Pub. Date: Jun. 20, 2002

(65) Prior Publication Data

US 2003/0011032 A1    Jan. 16, 2003

(30) Foreign Application Priority Data

Dec. 14, 2000  (JP)  .............................. 2000-379607

(51) Int. Cl.
*H01L 29/94*  (2006.01)
(52) U.S. Cl. .................................... 257/330; 257/296
(58) Field of Classification Search ................ 257/296, 257/332, 334, 330, 328, 331, 333, 297, 338, 257/345
See application file for complete search history.

(56) References Cited

U.S. PATENT DOCUMENTS 5,460,989 A * 10/1995 Wake ........................ 438/259
5,488,244 A * 1/1996 Quek et al. .................. 257/314
5,552,620 A * 9/1996 Lu et al. ...................... 257/302
5,578,851 A * 11/1996 Hshieh et al. ............... 257/330
6,020,600 A * 2/2000 Miyajima et al. ............. 257/76
6,063,669 A   5/2000 Takaishi
6,313,493 B1 * 11/2001 Mori et al. .................. 257/296
6,323,518 B1 * 11/2001 Sakamoto et al. ........... 257/330

FOREIGN PATENT DOCUMENTS

| JP | 4-212466   | 8/1992 |
| JP | 7-66297    | 3/1995 |
| JP | 9-232535   | 9/1997 |
| JP | 2001-210801 | 8/2001 |

OTHER PUBLICATIONS

Stephen A. Campbell. The Science and Engineering of Microelectronic Fabrication. 1996, Oxford University Press. pp. 136 an 137.*

* cited by examiner

Primary Examiner—Douglas W Owens
(74) Attorney, Agent, or Firm—Sonnenschein Nath & Rosenthal LLP

(57) ABSTRACT

In a semiconductor device having a memory element and a logic element formed on the same semiconductor substrate, a transistor of the memory element comprises a gate electrode (16) embedded within a trench (13) formed in a semiconductor substrate (11) through a gate insulating film (15) and a diffusion layer (17) formed on the side of the semiconductor substrate (11) at a sidewall of the trench (13), and a take-out electrode (20) connected to the diffusion layer (17) is provided so that the take-out electrode overlaps the gate electrode (16) through a first interlayer insulating film (insulating film) (18) on the gate electrode (16). A word line (16) is provided in the trench (13) and an impurity concentration of the diffusion layer (17) is decreased as a depth thereof is increased.

3 Claims, 8 Drawing Sheets

SEMICONDUCTOR DEVICE AND IT'S MANUFACTURING METHOD

TECHNICAL FIELD

The present invention relates to a semiconductor device and a method of fabricating the device, and more particularly to a semiconductor device in which a DRAM (Dynamic Random Access Memory) and a logic element are fabricated on the device in a mixed fashion and a method of fabricating such a device.

BACKGROUND OF THE INVENTION

Manufactures of semiconductor devices are competing every year in rapidly developing microfabrication technology. In particular, the manufactures of semiconductor devices intend to develop a complex device having a DRAM with a large capacity and a logic element capable of driving at a high speed fabricated on a single chip. As an arrangement of one example thereof, memory cell gates of the DRAM are provided on a substrate so that the gates are piled on one another. So-called self aligning contact is introduced to take out a diffusion layer of a memory cell transistor while the logic element is formed without using the self aligning contact.

However, in the piled-type DRAM, various kinds of problems become conspicuous.

Substrate density becomes higher and higher along with reduction in size of DRAM memory cells in order to keep their transistor performance. As a result, a matter of junction leak at a DRAM portion becomes more and more critical. Thus, it becomes difficult to suppress the junction leak of DRAM's of a megabit class. In other words, it becomes difficult to maintain data retention characteristic of DRAM's, which has been easily controlled. Accordingly, there is no possible solution other than one in which capacitor capacitance is increased for each generation of device.

Furthermore, along with the reduction in size of the DRAM cells, a contact area between a diffusion layer and a take-out electrode also becomes small. For this reason, contact resistance thereof tends to increase at a rate of twice per generation transition. In a generation of 0.1 μm or later, it is expected that the contact resistance will become several kilo ohms, which fact will be expected to influence on-resistance of a word transistor of the memory cell. Therefore, scattering of the contact resistance will also influence not only cell transistor but also operation of the DRAM seriously. Thus, it is requested to establish more precise fabrication technology.

Also, along with the reduction in size of the DRAM cell, interlayer insulation distance between a gate electrode of a cell transistor and the take-out electrode of the diffusion layer formed beside the gate electrode becomes small as the generation of the device proceeds. When fabricating a DRAM of a mega-bit class, the marginal distance of the interlayer insulation is supposed to be of from 20 nm to 30 nm to secure a withstand voltage. For this reason, it becomes difficult to form the take-out electrode of the diffusion layer with the distance equal to or smaller than the distance of withstand voltage limitation in fabricating a DRAM of the generation of 0.1 μm or later.

On the other hand, the performance of a transistor formed in a logic unit is also remarkably progressed. As for a logic transistor of the generation of the size of 0.1 μm or later, a request is supposed to be made such that a very thin film having a gate length of 50 nm to 70 nm and a gate insulation film of 1.5 nm or below is to be formed. If the required film thickness is lowered below this thickness, it is anticipated that employing silicon oxide ($SiO_2$), which has been conventionally employed because of its favorable nature, becomes difficult and that employing new insulating films such as those of zirconium oxide, hafnium oxide, tantalum oxide, aluminum oxide, BST (compound crystal of $BaTiO_3$ and $SrTiO_3$) will become indispensable.

When the gate insulating films made of the above-introduced insulating materials of zirconium oxide, hafnium oxide, tantalum oxide, aluminum oxide, BST or the like are fabricated, in order to avoid influence from a thermal treatment required for activating the diffusion layer or damage due to a plasma effected upon forming the gate electrode, a technique of replacement gate electrode is proposed in which after forming the diffusion layer a dummy gate pattern electrode is replaced. Even in the replacement gate electrode structure, due to a problem of suppressing depletion which becomes problematic upon fabricating a conventional polycrystalline silicon gate electrode, it is supposed that the above materials with relatively low thermal resistance should be employed.

Further, the fabrication process of the above replacement gate includes a step of exposing the upper face of the dummy gate pattern by chemical mechanical polishing (hereinafter referred to as CMP standing for Chemical Mechanical Polishing). Therefore, the fabrication process of the above replacement gate exhibits an unsatisfactory matching property with a DRAM cell of a stacked type which forms a capacitor with a self aligning contact at an upper portion of the gate electrode.

As described above, although the current technology is barely tolerable in fabricating the current generation device of 0.18 μm, any countermeasure is required in a future generation of 0.1 μm or later. In order to maintain the performance trend of the chip, it is expected that a drastic improvement will be required in the structure of stacked type DRAM.

SUMMARY OF THE INVENTION

According to the present invention, there are provided a semiconductor device and a method of fabricating the same which are intended to solve the above-identified problems.

A semiconductor device of the present invention is a semiconductor device having a memory element and a logic element formed on a same semiconductor substrate, wherein a transistor of the memory element comprises a gate electrode embedded within a trench formed in the semiconductor substrate through a gate insulating film and a diffusion layer formed on a surface side of the semiconductor substrate at a side wall of the trench, and a take-out electrode connected to the diffusion layer is provided so that the take-out electrode overlaps the gate electrode through an insulating film on the gate electrode.

Further, according to the present invention, there is provided a semiconductor device, wherein an element separating region is formed on the semiconductor substrate, and a word line connected to the gate electrode is formed so as to be connected to the gate electrode provided in the trench which is formed on the semiconductor substrate and the element separating region. Further, an impurity concentration of the diffusion layer is decreased as the depth thereof is increased.

According to the semiconductor device, the insulating film is provided over the gate electrode which is embedded into the semiconductor substrate through the gate insulating film, and the take-out electrode is provided through the insulating film to be connected to the diffusion layer so that the take-out electrode overlaps the gate electrode. Therefore, it becomes possible to secure a satisfactory allowance of thickness ranging from 20 nm to 30 nm or more for the insulating film on the gate electrode. Accordingly, it becomes possible to secure a withstand voltage across the gate electrode (word line) and the take-out electrode connected to the diffusion layer. Also, the gate electrode is embedded into the semiconductor substrate through the gate insulating film, and the diffusion layer is formed on the surface side of the semiconductor substrate. Therefore, a channel is formed so as to surround the semiconductor substrate on the bottom side of the trench at which the gate electrode is formed. Accordingly, an effective channel length is satisfactorily secured and hence it becomes possible to stabilize the transistor characteristic of the DRAM which will suffer from the severe short channel effect upon application of a back bias voltage. Moreover, it becomes possible for the take-out electrode to be connected to the entire surface of the diffusion layer on the side of the semiconductor substrate, with a result that contact resistance can be decreased.

Furthermore, the word line is formed so as to connect to the gate electrode of the trench which is formed in the semiconductor substrate and the element separating region. Therefore, it is possible to fabricate the word line together with the gate electrode in the same step. Also, the impurity concentration of the diffusion layer is decreased as the depth thereof is increased. Thus, it becomes possible to relax an electric field at a junction thereof and the performance of the data holding characteristic can be maintained.

According to the present invention, there is proposed a method of fabricating a semiconductor device having a memory element and a logic element formed on the same semiconductor substrate/ In the method, a memory transistor of the memory element is fabricated by a step of forming a trench on the semiconductor substrate and an element separating region formed on the semiconductor substrate, a step of forming a gate insulating film within the trench, a step of forming a gate electrode and a word line so as to fill the trench with an upper portion of the trench left uncovered, a step of forming a diffusion layer on the side of the semiconductor substrate surface at a side wall of the trench, a step of forming an insulating film so as to cover the upper portion of the trench, a step of forming a contact hole on the gate electrode so that the contact hole reaches the diffusion layer through the insulating film to overlap the gate electrode, a step of forming a take-out electrode within the contact hole, and a step of performing thermal treatment for activating the take-out electrode. In the method, a logic transistor of the logic element is fabricated by a step of forming a dummy gate pattern on the semiconductor substrate at the same layer including the gate electrode and the word line, a step of forming a low concentration diffusion layer of the logic transistor with the dummy gate pattern utilized as a mask, a step of forming a side wall on the side face of the dummy gate pattern, a step of forming a diffusion layer of the logic transistor with the dummy gate pattern and the side wall utilized as a mask, a step of covering a dummy gate pattern at the same layer with the insulating film, a step of exposing an upper portion of the dummy gate pattern in a process of flattening the insulating film after forming the take-out electrode within the contact hole, a step of forming a gate trench by removing the dummy gate pattern after effecting the thermal treatment for activating the take-out electrode, and a step of forming a gate electrode in the gate trench through a gate insulating film. The diffusion layer of the memory transistor is made so that the impurity concentration thereof is decreased as the depth thereof is increased.

According to the above method of fabricating the semiconductor device, the trench is formed in the semiconductor substrate and the gate electrode (word line) is formed so as to embed in the trench through the gate insulating film so that the upper portion of the trench is left uncovered. Further, the diffusion layer is formed on the surface side of the semiconductor substrate at the side wall of the trench, the insulating film is formed so as to cover the upper portion of the trench, and the contact hole reaching the diffusion layer is formed on the gate electrode through the insulating film so that the contact hole overlaps the gate electrode. With this arrangement, the take-out electrode formed within the contact hole and the gate electrode are separated from each other by the insulating film, and moreover it becomes possible to secure a sufficient thickness of from 20 nm to 30 nm or more, for example, for the insulating film.

Accordingly, it becomes possible to secure a withstand voltage across the gate electrode (word line) and the take-out electrode connected to the diffusion layer.

Further, the gate electrode is provided within the trench formed in the semiconductor substrate through the gate insulating film, and the diffusion layer is formed on the surface side of the semiconductor substrate. Therefore, the channel is formed so as to surround the semiconductor substrate on the bottom side of the trench in which the gate electrode is formed. Accordingly, effective channel length can be sufficiently secured and a back bias voltage may be effectively applied to stabilize the transistor characteristic of the DRAM cell which will suffer from a severe short channel effect. Moreover, it is possible for the take-out electrode to be connected to the diffusion layer on the entire surface on the side of the semiconductor substrate, with a result that the contact resistance can be decreased.

Furthermore, the word line is formed so as to connect to the gate electrode in the trench which is formed in the semiconductor substrate and the element separating region. Therefore, it is possible to fabricate the word line together with the gate electrode in the same process. Also, the diffusion layer is formed in such a manner that the impurity concentration thereof is decreased as the depth thereof is increased. Thus, it becomes possible to relax the electric field at the junction and the performance of the data holding characteristic can be maintained.

DETAILED DESCRIPTION OF THE PRESENTLY PREFERRED EMBODIMENTS

Figure 1:
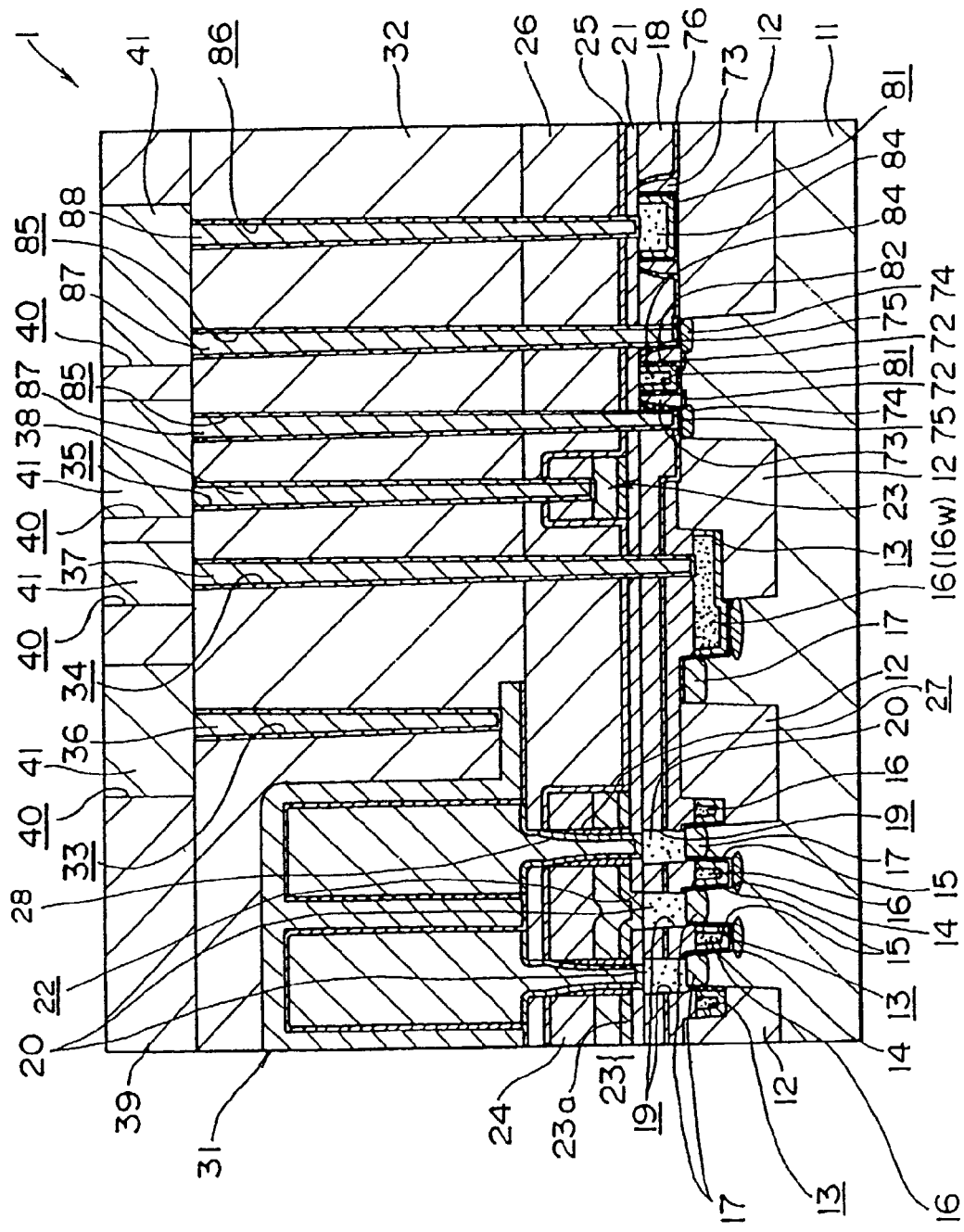
FIG. 1 is a schematic cross-sectional view of a structure of one example of an embodiment of the semiconductor device according to the present invention.

One example of an embodiment of a semiconductor device according to the present invention will be described with reference to FIG. 1 illustrating a schematic cross-sectional view of a structure of the device.

As shown in FIG. 1, a semiconductor substrate 11 has an element separating region 12 formed therein.

The element separating region is formed to have a depth of 0.1 µm to 0.2 µm, for example, by using an STI (Shallow Trench Isolation) technology, for example. A trench 13 is formed in the semiconductor substrate 11 and the element separating region 12 so as to have a depth of approximately 50 nm to 100 nm, for example. In the trench 13, there is provided a word line (gate electrode) 16 through a gate insulting film 15. Even if there is some difference between the depth of the trench 13 formed at the semiconductor substrate 11 and that of the trench 13 formed at the element separating region 12, no problem will be expected.

A channel diffusion layer 14 is formed on the semiconductor substrate 11 at the bottom portion of the trench 13. The channel diffusion layer 14 should have a high impurity concentration (e.g., $1.0 \times 10^{18}/cm^3$ to $1.0 \times 10^{19}/cm^3$). However, this channel diffusion layer is formed on a portion of the semiconductor substrate 11 corresponding to the bottom of the trench 13, which is formed by digging the semiconductor substrate 11. Therefore, the side wall of the trench 13 or the upper portion of the same may have an impurity concentration almost the same as that of the substrate. Thus, the concentration thereof at the region may be extremely low (e.g., $1.0 \times 10^{17}/cm^3$ to $1.0 \times 10^{18}/cm^3$).

The gate insulating film 15 is designed to have a slightly large film thickness as compared with that of the most advanced logic transistor. Further, the gate insulating film is formed to have a slightly long gate length. Thus, a silicon oxide film may be applied thereto by thermal oxidation even in the current generation. Therefore, the gate insulating film 15 provided in the DRAM region is formed of a silicon oxide film having a thickness of 1.5 nm to 2 nm, for example.

The word line (gate electrode) 16 is requested to have a distance guaranteeing a desired withstand voltage with respect to a take-out electrode 20 which will be described later on. That is, the surface of the word line is formed at a level lowered with respect to the surface of the semiconductor substrate 11 at the upper portion of the trench 13 by a distance of at least from 30 nm to 50 nm, or more desirably, from 40 nm to 50 nm. In the present embodiment, the surface of the word line is formed at a level lowered by a distance of about 50 nm, for example.

The word line (gate electrode) 16 has been conventionally made of a material of polycide structure such as of tungsten silicide ($WSi_2$)/polycrystalline silicon. However, in order to suppress delay, this material may be replaced with a material of poly-metal gate structure with heat resistant property such as of tungsten/tungsten nitride/polycrystalline silicon or cobalt/cobalt silicide/polycrystalline silicon, for example. In the present embodiment, since an N-channel transistor is to be constructed, the gate electrode and the word line are formed of poly-metal gate structure. Therefore, problems such as penetration of a boron atom from its own region or segregation of such boron atom toward an interface of the tungsten nitride will not occur.

A DRAM region diffusion layer 17 is formed at an upper side wall portion of the trench 13 on the side of the semiconductor substrate 11. The diffusion layer 17 is arranged to have such a concentration profile which becomes the lowest possible at the bottom portion of the layer and it is desirable to relax the electric field at the junction with the semiconductor substrate 11. The diffusion layer 17 is originally arranged to have a low concentration at the junction portion on the side of the semiconductor substrate 11. Therefore, a junction of a low electric field intensity is formed together with the diffusion layer 17. A DRAM data retaining characteristic is maintained owing to the junction.

As described above, the gate electrode 16 is embedded in the semiconductor substrate 11 through the gate insulating film 15 and the diffusion layer 17 is formed on the surface of the semiconductor substrate 11. Thus, the channel is formed so as to surround the semiconductor substrate 11 on the trench bottom where the gate electrode 16 is formed. Owing to this structure, an effective channel length can be secured and a back bias voltage can be effectively applied to stabilize the transistor characteristic of the DRAM cell which will suffer from a severe short channel effect.

A first interlayer insulating film (insulating film) 18 is formed on the entire surface of the semiconductor substrate 11. The surface of the first interlayer insulating film 18 is planarized. A contact hole 19 is provided on the first interlayer insulating film 18 so that the hole reaches the diffusion layer 17 in the DRAM region. It is desirable for the contact hole 19 to have an opening of a largest possible diameter so that a take-out electrode can be contacted to the entire surface of the diffusion layer 17. Owing to such arrangement, contact resistance will be decreased. Further, although the diagram intentionally shows a status of an arrangement in which a certain alignment shift is brought about, if an excessive over etching is not taken place upon providing the contact hole, it becomes possible to secure a physical distance for the word line take-out electrode which is formed in the contact hole 19. In terms of projection design as viewed from the upper side, the contact hole 19 is designed to completely overlap the word line (gate electrode) 16. A take-out electrode 20 made of phosphorus-doped polycrystalline silicon is formed in the contact hole 19.

On the other hand, logic transistors are formed in the logic region. That is, a trench 81 is formed in the first interlayer insulating film 18 so as to reach the semiconductor substrate 11, and a gate electrode 84 is formed within the trench through a gate insulating film 82. A side wall of the trench 81 is made up with a side wall 73. Low concentration diffusion layers 72, 72 are formed on the semiconductor substrate 11 at a lower portion of the side wall 73. Diffusion layers 74, 74 are formed on the semiconductor substrate 11 on both the sides of the gate electrode 84 through the concentration diffusion layers 72, 72. The trench 81 formed in the first interlayer insulating film 18 is disposed on the element separating region 12 of the logic region, and a word line 84 is formed within the trench 81. A side wall of the trench on which the word line 84 is formed is also made up with the side wall 73, as described above.

Further, a second interlayer insulating film 21 is formed on the first interlayer insulating film 18 so as to cover the take-out electrode 20, the gate electrode 84 and so on. A bit contact hole 22 is formed in the second interlayer insulating film 21. Also, a bit line 23 is formed on the second interlayer insulating film 21, and a part of the bit line is connected to the take-out electrode 20 through the bit contact hole 22. The bit line 23 is made of a metal wire, and an intimate contact layer 23a is formed at a lower portion thereof while an offset insulating film 24 is formed at an upper portion thereof.

An etching stopper layer 25 and a third interlayer insulating film 26 are formed on the second interlayer insulating film 21 so as to cover the bit line 23. The surface of the third interlayer insulating film 26 is planarized. A contact hole 27 connecting to the take-out electrode 20 is formed in the third interlayer insulating film 26. A side wall insulating film 28 is formed within the contact hole 27 so as to provide electric insulation with the bit line 23.

Further a capacitor 31 connected to a memory node is formed. In this case, the employed capacitor is one of MIM (Metal/insulator/Metal) structure in which thermal treatment is unnecessary. It is expected that the capacitor 31 of the MIM structure becomes indispensable for developing a DRAM belonging to the generation of 0.1 μm or following generations. In the current stage, the capacitor employs an electrode made of ruthenium (Ru) or ruthenium (Ru) oxide type material, and a dielectric film made of BST (mixed crystal of BaTiO$_3$ and SrTiO$_3$) type film, for example.

The arrangement of the capacitor is not limited to the capacitor 31 of the MIM structure but it is possible to apply a memory node electrode of HSG utilizing crystal particles of polycrystalline silicon or a memory node electrode of a cylindrical shape, for example. Further, the insulating film may be composed of a stacked type film made of a silicon oxide film, a silicon nitride film and a silicon oxide film (i.e., ONO film), a tantalum oxide film, an aluminum oxide film and so on which are conventionally utilized.

A fourth interlayer insulating film 32 is formed on the third interlayer insulating film 26 so as to cover the capacitor 31 of the MIM structure. The surface of the fourth interlayer insulating film 32 is planarized. Contact holes 33, 34, 35, 85, 86 for forming a capacitor take-out electrode, a word line take-out electrode, a bit line take-out electrode, a diffusion layer take-out electrode in the logic region, a gate take-out electrode in the logic region, and so on are formed through the fourth interlayer insulating film 32 and the first interlayer insulating film 18. Further, the contact holes 33, 34, 35, 85, 86 have formed therein a capacitor take-out electrode 36, a word line take-out electrode 37, a bit line take-out electrode 38, a diffusion layer take-out electrode 87 in the logic region, a gate take-out electrode 88 in the logic region and so on.

A fifth interlayer insulating film 39 is formed on the fourth interlayer insulating film 32. Various wiring trench 40 reaching the electrodes 36 to 38, 87, 88 are formed in the fifth interlayer insulating film 39, and a first wiring 41 is formed in each of the wiring trenches 40. The first wiring 41 is made of a copper wire, for example. Although not shown, upper layer wiring may be formed depending on necessity.

According to the above arrangement of the semiconductor device 1, the first interlayer insulating film (insulating film) 18 is provided over the gate electrode 16 which is embedded into the semiconductor substrate 11 through the gate insulating film 15, and the take-out electrode 20 is provided through the first interlayer insulating film to be connected to the diffusion layer 17 so that the take-out electrode overlaps the gate electrode 15. Therefore, it becomes possible to secure a satisfactory allowance of thickness ranging from 20 nm to 30 nm or more for the first interlayer insulating film 18 over the gate electrode 16. Accordingly, it becomes possible to secure a withstand voltage across the gate electrode (word line) 16 and the take-out electrode 20 connected to the diffusion layer 17.

Also, the gate electrode 16 is embedded into the semiconductor substrate 11 through the gate insulating film 15, and the diffusion layer 17 is formed on the surface side of the semiconductor substrate 11. Therefore, the channel is formed so as to surround the semiconductor substrate 11 on the bottom side of the trench 13 at which the gate electrode 16 is formed. Accordingly, an effective channel length can be satisfactorily secured and hence it becomes possible to stabilize the transistor characteristic of the DRAM which will suffer from a severe short channel effect upon application of a back bias voltage. Moreover, the take-out electrode 20 can be made connected to the entire surface of the diffusion layer 17 on the side of the semiconductor substrate 11, with the result that the contact resistance can be decreased.

Furthermore, the word line 16 (16w) is formed so as to connect to the gate electrode of the trench 13 which is formed in the semiconductor substrate 11 and the element separating region 12. Therefore, it is possible to fabricate the word line together with the gate electrode 16 in the same process. Also, the impurity concentration of the diffusion layer 17 is decreased as the depth thereof is increased. Thus, it becomes possible to relax the electric field at the junction and the performance of the data holding characteristic can be maintained.

A method of fabricating the semiconductor device according to the present invention will be described with reference to schematic cross-sectional views of FIGS. 2A to 8. In FIGS. 2A to 8, similar parts corresponding to those in the above described FIG. 1 are identified by the same reference numerals.

Figure 2A:
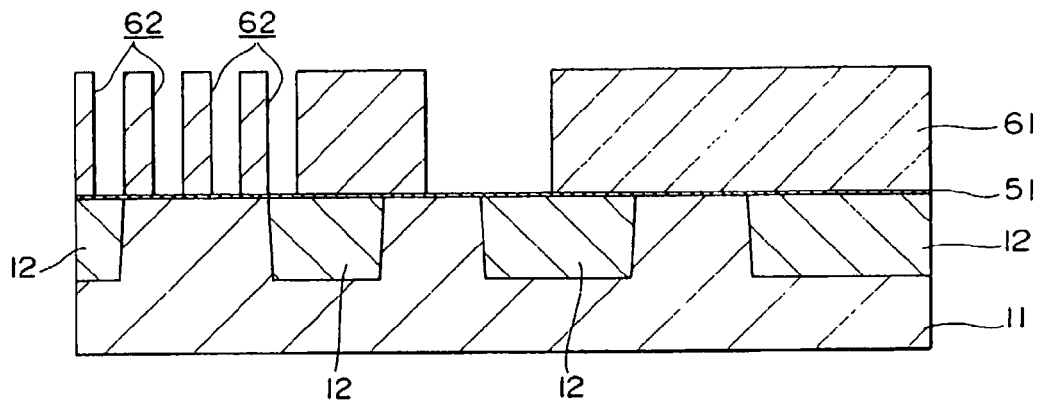
FIGS. 2A to 2B are each schematic cross-sectional view of a structure of one example of the embodiment according to a method of fabricating a semiconductor device of the present invention.

As shown in FIG. 2A, the element separating region 12 is formed in the semiconductor substrate 11 by using an STI (Shallow Trench Isolation) technology, for example. Then a resist film 61 is formed for use of lithography technology, and thereafter an opening 62 is provided at a portion of the resist film 61 which will be formed into the gate electrode and the word line of the DRAM portion. While, in the figure there is shown the semiconductor substrate 11 having a buffer layer 51 made of silicon oxide formed thereon, the buffer layer 51 may be obviated depending on the case. Further, the element separating region 12 is formed to have a depth of about 0.1 μm to 0.2 μm.

Figure 2B:
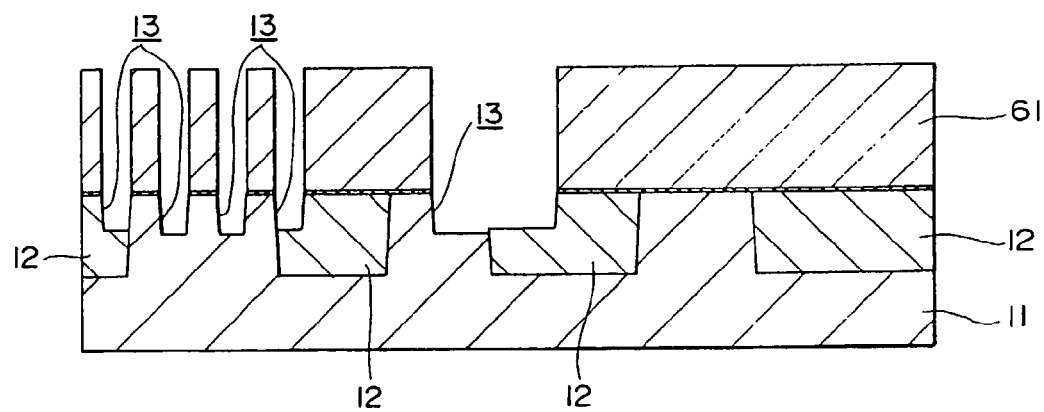

Subsequently, as shown in FIG. 2B, the resist film 61 is utilized as an etching mask and the buffer layer 51, the element separating region 12 and the semiconductor substrate 11 are subjected to etching process (e.g., sequential etching process) so that the trench 13 is formed in the element separating region 12 (field) and the semiconductor substrate 11. The trench 13 is formed to have a depth of about 50 nm to 100 nm, for example. No problem will be brought about even if there is some difference between the depth of the trench 13 formed in the semiconductor substrate 11 and the depth of the trench 13 formed in the element separating region 12.

Thereafter, the resist film 61 is removed by using an ordinary technology and the buffer layer 51 is also removed by etching.

Figure 3A:
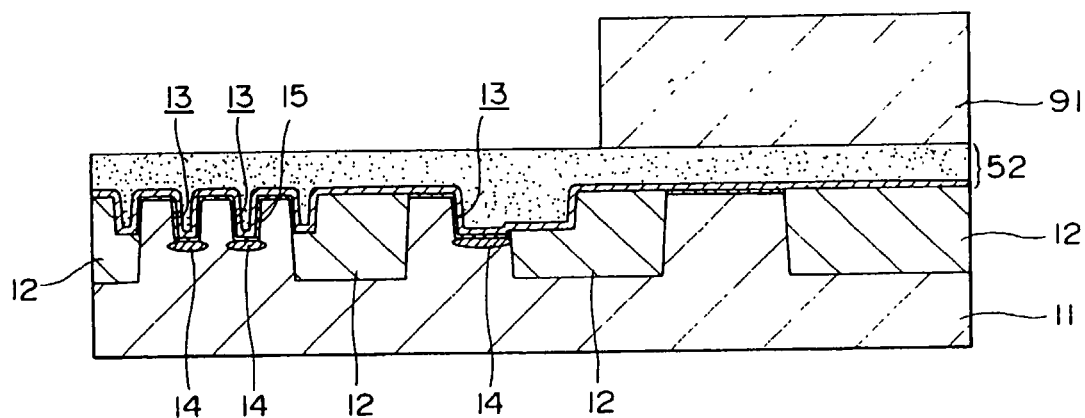
FIGS. 3A to 3B are each schematic cross-sectional view of a structure of one example of the embodiment according to the method of fabricating a semiconductor device of the present invention.

Subsequently, as shown in FIG. 3A, for example, an ion implantation method is performed for channel doping at the DRAM region so that the channel diffusion layer 14 is formed at the bottom of the trench 13 on the semiconductor substrate 11. Thereafter, the gate insulating film 15 of the DRAM section is formed on the inner surface of the trench 13, on the semiconductor substrate 11 and on the element separating region 12. Further, a gate electrode forming film 52 is formed on the semiconductor substrate 11 and the element separating region 12 so that the trench 13 is embedded under the film.

The region whose impurity concentration should be kept high (e.g., $1.0 \times 10^{18}/cm^3$ to $1.0 \times 10^{19}/cm^3$), as a channel of a word transistor in the DRAM region, is only a part of the semiconductor substrate 11 corresponding to the bottom of the trench 13 obtained digging the semiconductor substrate 11. Therefore, the side wall or the upper portion of the trench 13 need not be subjected to the ion implantation to make the portion have an impurity concentration as high as that of the substrate. Accordingly, it is possible to form the region to have an extremely low impurity concentration (e.g., $1.0 \times 10^{17}/cm^3$ to $1.0 \times 10^{18}/cm^3$).

The DRAM cell is formed to have a gate insulating film relatively large thickness as compared with that of the most advanced logic transistor. Also, the cell is formed to have a relatively long gate length. Therefore, although this device belongs to the current generation, silicon oxide film formed by thermal oxidation can be applied. Therefore, the gate insulating film 15 in the DRAM region is formed of the silicon oxide film having a thickness of approximately 1.5 nm to 2 nm, for example. The gate electrode forming film 52 has been conventionally made of a material of polycide structure such as of tungsten silicide ($WSi_2$)/polycrystalline silicon. However, in order to suppress delay, this material maybe replaced with a material of poly-metal gate structure with heat resistant property such as of tungsten/tungsten nitride/polycrystalline silicon or cobalt/cobalt silicide/polycrystalline silicon, for example. In the present process, since an N-channel transistor is to be constructed, the gate electrode and word line are formed of poly-metal gate structure (in the figure, a metal portion and a polycrystalline silicon portion are illustrated). Therefore, problems such as penetration of a boron atom from its own region or segregation of such boron atom toward an interface of the tungsten nitride will not occur.

In addition, it is possible to utilize the gate insulating film 15 and the gate electrode forming film 52 as a dummy gate pattern in the logic region. Therefore, the gate electrode forming film 52 is requested to have a thickness of about 150 nm to 200 nm in total.

Further, a resist film 91 is formed over the whole upper surface of the device, and thereafter lithography technology is utilized to carry out patterning so that only the logic region is covered with the resist film 91 in order to form a word line (including the gate electrode) in the DRAM region. Then, etch back is performed on the DRAM region by using the resist film 91 as a mask.

Figure 3B:
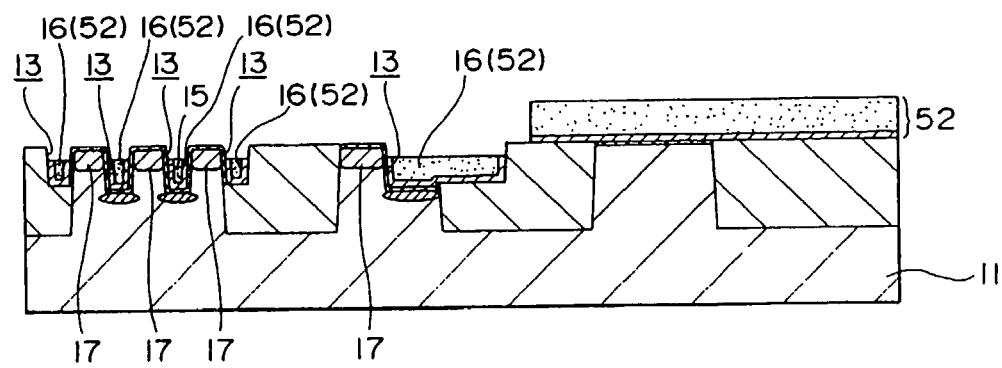

As shown in FIG. 3B, the word line (a part thereof becomes the gate electrode) 16 is formed in such a manner that the gate electrode forming film 52 is left unremoved only within the trench 13. At this time, an etch back for forming the word line 16 in the DRAM region is performed so that the resulting step is lowered with respect to the level of the semiconductor substrate 11 by about 50 nm, for example. Thus, it becomes possible to secure a withstand voltage distance relative to the diffusion layer take-out electrode which will be formed in the following stage.

Subsequently, the diffusion layer 17 is formed in the DRAM region on the surface side of the semiconductor substrate 11 by using ion implantation. When this ion implantation is carrying out, phosphorus is implanted in consideration of data holding characteristic. At this time, it is desirable that the bottom portion of the diffusion layer 17 is set to have an impurity concentration as low as possible so that the electric field of the semiconductor substrate 11 can be relaxed. The junction portion of the diffusion layer 17 on the side of the semiconductor substrate 11 is originally set to a relatively low impurity concentration. Thus, a junction of a low electric field intensity is formed together with the diffusion layer 17. This junction maintains the DRAM data holding characteristic tendency. When the diffusion layer 17 is formed on the DRAM region, the logic region is covered with the gate electrode forming film 52. Thus a mask is unnecessary and hence mask forming process is also unnecessary.

As described above, the gate electrode 16 is embedded in the semiconductor substrate 11 through the gate insulating film 15 and the diffusion layer 17 is formed on the surface side of the semiconductor substrate 11. Therefore, a channel is formed so as to surround the semiconductor substrate 11 on the bottom of the trench 13 at which the gate electrode 16 is formed. For this reason, effective channel length can be secured and hence it becomes possible to stabilize the transistor characteristic of the DRAM cell which will suffer from a severe short channel effect upon application of a back bias voltage.

Figure 4A:
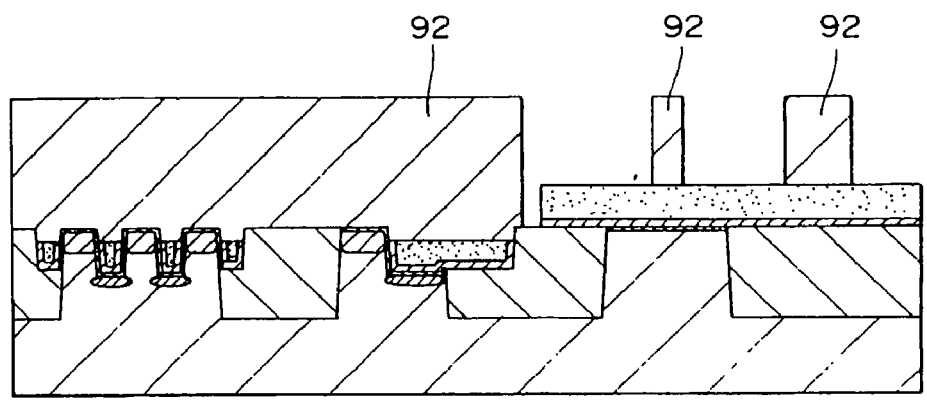
FIGS. 4A to 4B are each schematic cross-sectional view of a structure of one example of the embodiment according to the method of fabricating the semiconductor device of the present invention.

As shown in FIG. 4A, a patterning for the dummy gate pattern is performed on the logic region. Initially, a resist film 92 is formed over the upper surface of the device. Then, a lithography technology is performed so that the resist film 92 is formed into a gate electrode pattern in the logic region. At this time, the DRAM region is protected by the resist film 92.

Figure 4B:
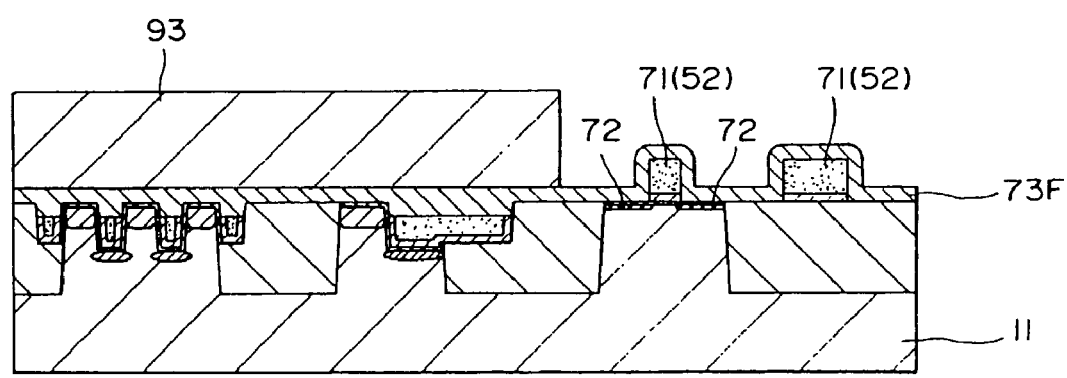

As shown in FIG. 4B, the resist film 92 (see FIG. 4A) is utilized as an etching mask and the gate electrode forming film 52 is subjected to an etching work so as to form a dummy gate pattern 71 in the logic region. Thereafter, the resist film 92 is removed.

Then, a resist film (not shown) is formed so that a part thereof corresponding to an n-channel transistor forming region in the logic region is formed into an opening. Subsequently, ion implantation is carried out on the semiconductor substrate 11 by using the resist film as a mask. Thus, low concentration diffusion layers 72, 72 of the n-channel transistor are formed. Thereafter, the resist film is removed. In a similar manner, a resist film (not shown) is formed so that a part thereof corresponding to a p-channel transistor forming region in the logic region is formed into an opening. Subsequently, ion implantation is carried out on the semiconductor substrate 11 by using the resist film as a mask. Thus, an extension (not shown) of the p-channel transistor is formed. Thereafter, the resist film is removed.

Then, a sidewall forming film 73F is formed over the entire upper surface of the device. The side wall forming film 73F is formed so that the film is directly contacted to the upper surface of the gate electrode 16 of the DRAM region.

Therefore, it is desirable for the film to be formed of silicon oxide having an internal stress lower than that of silicon nitride.

Alternatively, the side wall forming film may be formed of a stacked type film made of a silicon oxide film and a silicon nitride film. Also, the side wall forming film may be formed of a silicon oxide nitride film. Thereafter, a resist film 93 is formed over the entire upper surface of the device. For example, a lithography technology is carried out to remove the resist film 93 in the logic region but the resist film 93 is left the DRAM region. Thus, the DRAM region is protected. Under such condition, the side wall forming film 73F is subjected to etch back.

Figure 5A:
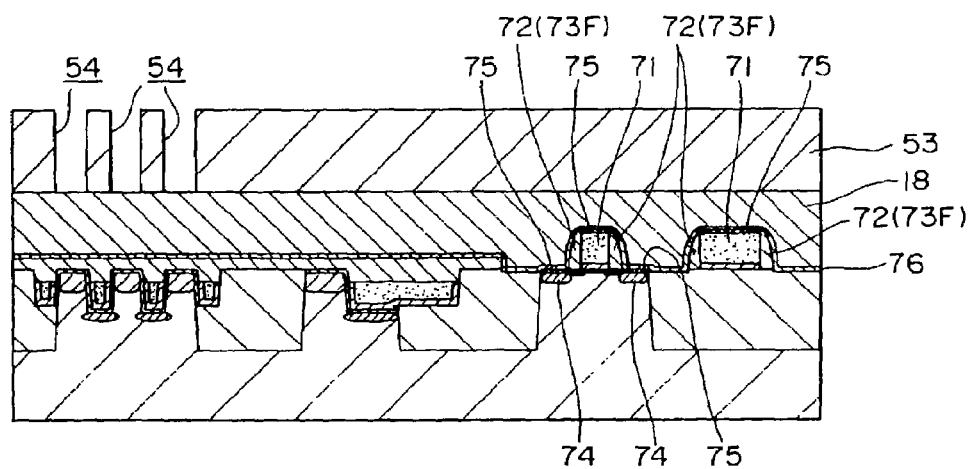
FIGS. 5A to 5B are each schematic cross-sectional view of a structure of one example of the embodiment according to the method of fabricating the semiconductor device of the present invention.

As a consequence, as shown in FIG. 5A, the dummy gate pattern 71 comes to have on the side wall thereof a side wall 73 which is made from the side wall forming film 73F. Then, a resist film (not shown) is formed so that a part thereof corresponding to the n-channel transistor forming region in the logic region is formed into an opening. Subsequently, ion implantation is carried out on the semiconductor substrate 11 by using the resist film as a mask. Thus, diffusion layers 74, 74 of the n-channel transistor are formed. Thereafter, the resist film is removed. In a similar manner, a resist film (not shown) is formed so that a part thereof corresponding to the p-channel transistor forming region in the logic region is formed into an opening. Subsequently, ion implantation is carried out on the semiconductor substrate 11 by using the resist film as a mask. Thus, a diffusion layer (not shown) of the p-channel transistor is formed. Thereafter, the resist film is removed.

Further, an ordinary silicide technology is utilized to selectively form a silicide layer 75 on the respective diffusion layer 74 in the logic region. At this time, the silicide layer 75 is also formed on the top of the dummy gate pattern 71. However, this silicide layer will be removed in the subsequent step of chemical mechanical polishing (hereinafter referred to as CMP. CMP stands for Chemical Mechanical Polishing). If it is undesirable for the silicide layer to be formed on the tungsten film of the dummy gate pattern 71, a capping layer made of a silicon nitride film (not shown) may be formed on the dummy gate pattern 71 in advance. Thus, the dummy gate pattern 71 can be prevented from being made into silicide at the upper face thereof.

Then, a cap insulating film 76 is formed over the entire upper face of the semiconductor substrate 11. The cap insulating film 76 has an effect of suppressing a junction leak in a region where the silicide layer is formed, but to provide this layer is not always necessary. Subsequently, the interlayer insulating film (insulating film) 18 is formed on the entire upper face of the semiconductor substrate and thereafter the surface of the interlayer insulating film 18 is planarized by CMP. A method for planarizing the surface of the interlayer insulating film 18 is not limited to the CMP but any method may be employed so long as the method achieves the planarization. For example, etch back method can be employed. Thereafter, a resist film 53 is formed on the interlayer insulating film 18, and then a contact hole pattern 54 is formed in the resist film by using a lithography technology.

Figure 5B:
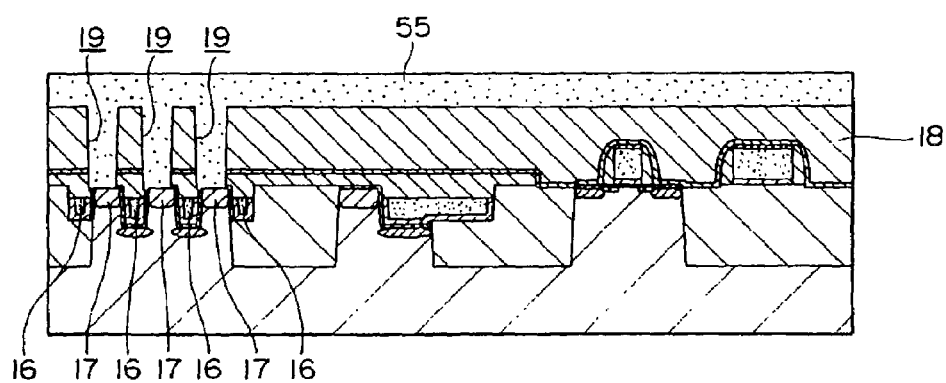

Subsequently, as shown in FIG. 5B, a contact hole 19 is formed so as to reach the diffusion layer 17 of the DRAM region through the first interlayer insulating film 18 by using the resist film [see Reference (5) in FIG. 4] as an etching mask. At this time, the word line (gate electrode) 16 in the DRAM region is disposed under the surface of the semiconductor substrate 11 at a level which is lower than the diffusion layer to be contacted. Therefore, any particular technology such as self align contact technology is unnecessary. It is desirable for the contact hole 19 to have an opening of a largest possible diameter so that a take-out electrode can be contacted to the entire surface of the diffusion layer 17. Owing to such arrangement, contact resistance will be decreased. Further, although the diagram intentionally shows a status of an arrangement in which a certain alignment shift is brought about, if an excessive over-etching is not taken place upon providing the contact hole, it becomes possible to secure a physical distance for the word line take-out electrode which is formed in the contact hole 19 in the subsequent steps. In terms of projection design as viewed from the upper side, the contact hole 19 is designed to completely overlap the word line (gate electrode) 16.

Subsequently, a take-out electrode forming film 55 is formed on the first interlayer insulating film 18 so as to embed the contact hole 19 embedded under the film. The take-out electrode forming film 55 is formed of phosphorus-doped polycrystalline silicon, for example. If decreasing the junction leak in the DRAM region is taken into account, it is desirable for the take-out electrode forming film 55 to be formed of phosphorus-doped polycrystalline silicon. Thereafter, thermal treatment is carried out for activating the phosphorus-doped polycrystalline silicon. As the heat treatment, a step of rapid thermal annealing (hereinafter referred to as RTA. RTA stands for Rapid Thermal Annealing) at a temperature of about 900° C. is necessary. Thereafter, since a step of forming a gate electrode of the logic region is carried out, heat treatment at a high temperature shall not be included at all.

Figure 6A:
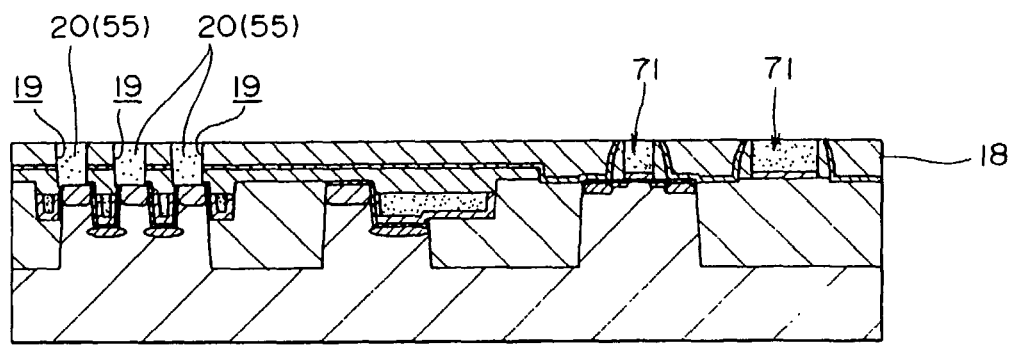
FIGS. 6A to 6B are each schematic cross-sectional view of a structure of one example of the embodiment according to the method of fabricating the semiconductor device of the present invention.

Thereafter, as shown in FIG. 6A, a surplus portion of the take-out electrode forming film 55 (phosphorus-doped polycrystalline silicon) on the first interlayer insulating film 18 is removed by using a CMP, for example, whereby the take-out electrode 20 made of the take-out electrode forming film 55 is formed within the contact hole 19. The first interlayer insulating film 18 is subjected to polishing so that the surface thereof is planarized. At this time, the upper face of the dummy gate pattern 71 in the logic region is exposed.

Figure 6B:
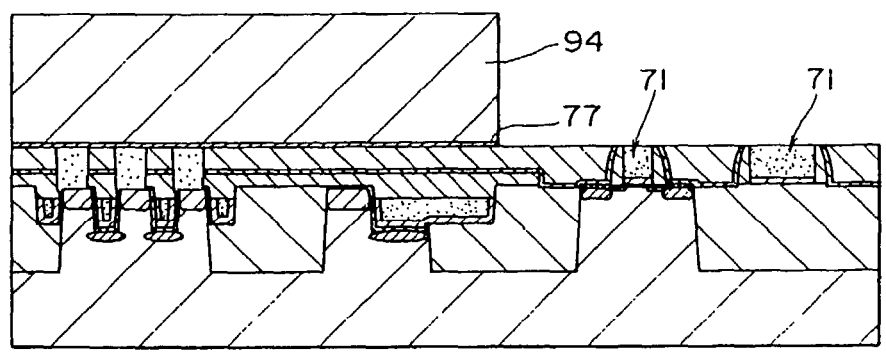

Subsequently, as shown in FIG. 6B, a cap insulating layer 77 is formed so as to protect the take-out electrode 20 which is formed in the DRAM region for taking out the diffusion layer. A resist film 94 is formed and then lithography technology is carried out so that the resist film 94 is left unremoved only in the DRAM region. Since the cap insulating film 77 will be removed in the step of CMP carried out later, any material can be employed. For example, this cap insulating film may be made of silicon nitride or a silicon oxide. Thereafter, the dummy gate pattern 71 in the logic region is removed.

Figure 7A:
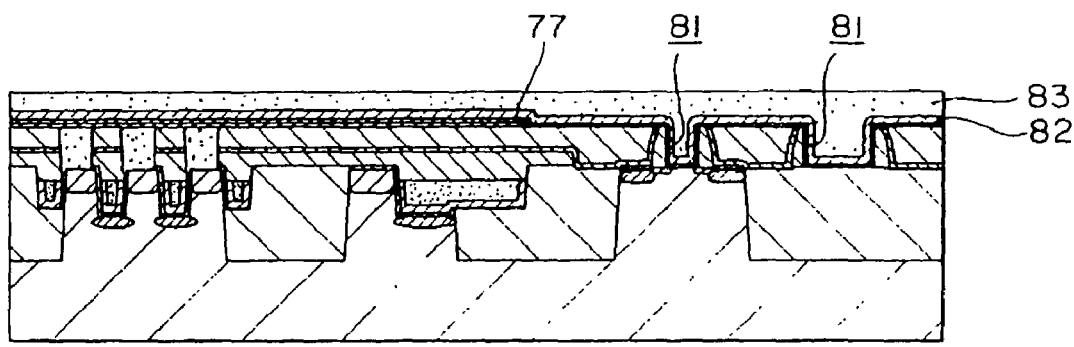
FIGS. 7A to 7B are each schematic cross-sectional view of a structure of one example of the embodiment according to the method of fabricating the semiconductor device of the present invention.

As a consequence, as shown in FIG. 7A, a trench 81 is formed at a portion from which the dummy gate pattern has been removed. Since the base of the dummy gate pattern is made of a silicon oxide type material, the dummy gate pattern may be removed by reactive ion etching. Alternatively, the dummy gate pattern may be removed by wet etching using sulfuric acid/hydrogen peroxide fluoronitric acid.

Figure 7B:
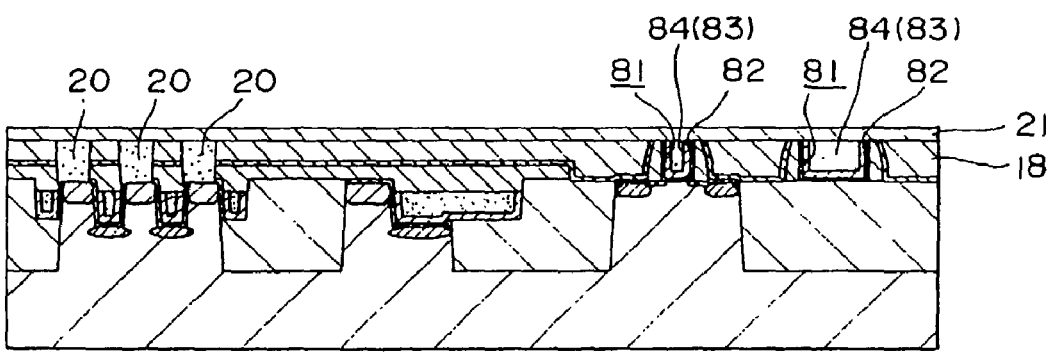

As shown in FIG. 7B, a gate insulating film 82 is formed on the inner wall of the trench 81 in the logic region. Thereafter, a gate electrode forming film 83 is formed so as to fill the inner space of the trench 81. The gate insulating film 82 and the gate electrode forming film 83 are also formed on the cap insulating film 77. The gate insulating film 82 is made of a silicon oxide film. However, this film may be made of high dielectric property materials such as zirconium oxide, hafnium oxide, tantalum oxide, aluminum oxide, and BST. Further, in general, the gate electrode forming film 83 is made of a stacked type film of tungsten film/titanium nitride film.

The surplus portions of the gate insulating film 82 and the gate electrode forming film 83 on the first interlayer insulating film 18 are again removed by CMP. Thus, a gate electrode 84 made of the gate electrode forming film 83 is formed within the trench 81 with the gate insulating film 82 interposed therebetween. Then, the surface of the first interlayer insulating film 18 is planarized. As a consequence, the gate electrode 84 in the logic region is exposed at the upper portion thereof. At this time, the take-out electrode 20 for taking out the electric status of the diffusion layer of the DRAM region is also polished at the upper portion thereof, but this polishing will cause no problem at all.

Subsequently, a cap insulating film (second interlayer insulating film) 21 is provided over the entire upper surface of the device so that the film covers the take-out electrode 20 in the DRAM region and the gate electrode 84 in the logic region.

Figure 8:
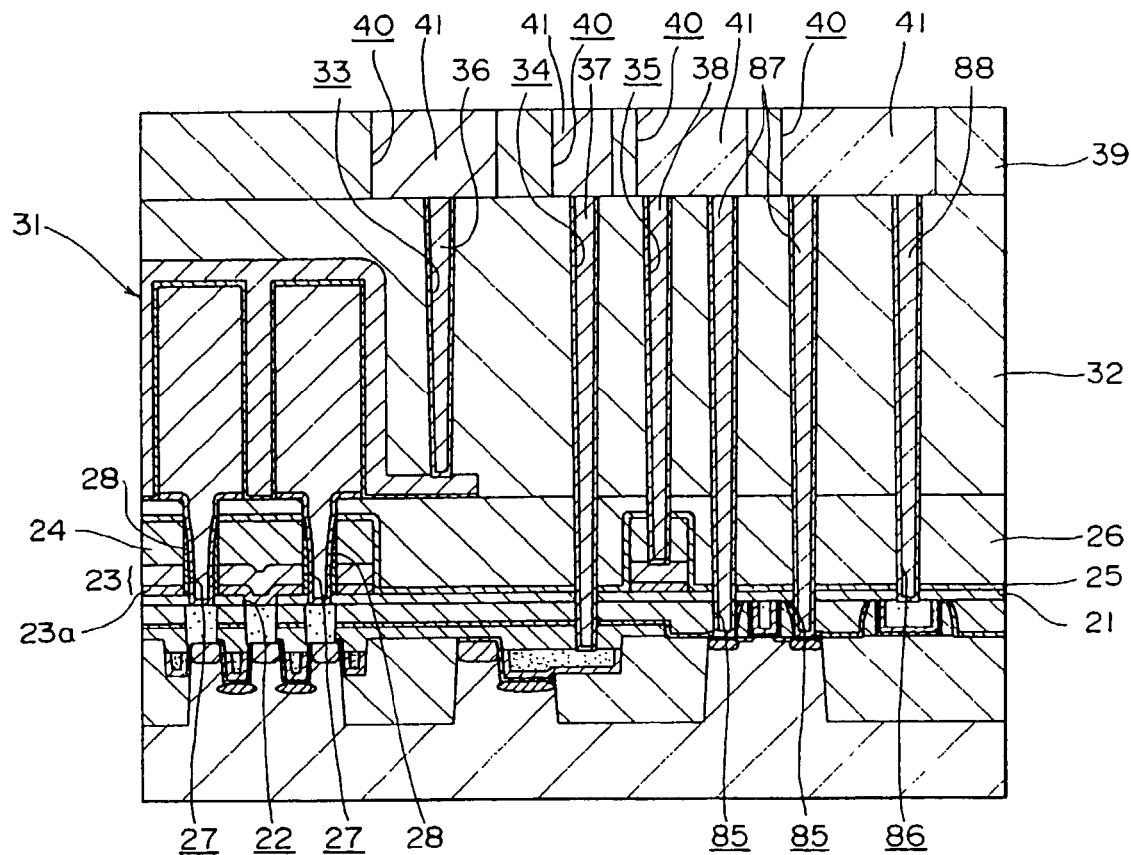
FIG. 8 is a schematic cross-sectional view of a structure of one example of the embodiment according to the method of fabricating the semiconductor device of the present invention.

Thereafter, as shown in FIG. 8, an ordinary DRAM fabrication process is carried out. That is, the second interlayer insulating film 21 is formed and then a bit contact hole 22 is formed. Subsequently, a bit line 23 is formed of a metal electrode. The bit line 23 is formed to have an intimate contact layer 23a provided at the lower end thereof and an offset insulating film 24 provided at the upper end thereof. Thereafter, an etching stopper layer 25 is provided to cover the bit line 23 and a third interlayer insulating film 26 is formed. Then, the third interlayer insulating film 26 is planarized. Subsequently, a contact hole 27 connecting to the take-out electrode 20 is provided in the third interlayer insulating film 26 by using a technology for forming a self alignment contact. A side wall insulating film 28 is formed on the inner side of the contact hole 27 so that electric insulation is established relative to the bit line 23.

Subsequently, a capacitor 31 of an MIM (Metal/insulator/Metal) structure in which thermal treatment is unnecessary is formed. It is expected that the capacitor 31 of the MIM structure becomes indispensable for developing a DRAM belonging to the generation of 0.1 µm or following generations. In the current stage, the capacitor has employed an electrode made of ruthenium (Ru) or ruthenium (Ru) oxide type material, and a dielectric body film made of BST (mixed crystal of $BaTiO_3$ and $SrTiO_3$) type film, as an example.

Subsequently, a fourth interlayer insulating film 32 is formed on the third interlayer insulating film 26 so as to cover the MIM structure capacitor 31. Thereafter, a CMP is carried out to planarize the surface of the fourth interlayer insulating film 32. Subsequently, contact holes 33, 34, 35, 85, 86 and so on for forming a word take-out electrode, a bit line take-out electrode, a diffusion layer take-out electrode in the logic region, a gate take-out electrode in the logic region and so on are formed through the fourth interlayer insulating film 32 and the first interlayer insulating film 18. Further, a capacitor take-out electrode 36, a word line take-out electrode 37, a bit line take-out electrode 38, a diffusion layer take-out electrode 87 in the logic region, a gate take-out electrode 88 in the logic region and so on are formed in the contact holes 33, 34, 35, 85, 86 and so on. Further, a fifth interlayer insulating film 39 is formed on the fourth interlayer insulating film 32. Subsequently, wiring trenches 40 are formed in the fifth interlayer insulating film 39 so that the trenches reach the electrodes 36 to 38, 87, 88 and so on. Thus, a first wiring 41 is formed in the wiring trench 40. The first wiring 41 is made of copper, for example. Although not shown, an upper layer wiring may be formed depending on necessity.

According to the above method of fabricating the semiconductor device 1, the trench 13 is formed in the semiconductor substrate 11 and the gate electrode (word line) 16 is formed so as to be embedded in the trench through the gate insulating film 15 so that the upper portion of the trench 13 is left not filled. Further, the diffusion layer 17 is formed on the surface side of the semiconductor substrate 11 at the side wall of the trench 13, the first interlayer insulating film (insulating film) 18 is formed so as to embed the upper portion of the trench 13, and the contact hole 19 reaching the diffusion layer 17 is formed on the gate electrode 16 through the first interlayer insulating film 18 so that the contact hole 19 overlaps the gate electrode 16. With this arrangement, the take-out electrode 20 formed within the contact hole 19 and the gate electrode 16 are separated from each other by the first interlayer insulating film 18, and moreover it becomes possible to secure a sufficient thickness of 30 nm or more, for example, for the first interlayer insulating film 18. Accordingly, it becomes possible to secure a withstand voltage across the gate electrode (word line) 16 and the take-out electrode 20 connected to the diffusion layer 17.

Further, the gate electrode 16 is embedded within the trench 13 formed in the semiconductor substrate 11 through the gate insulating film 15, and the diffusion layer 17 is formed on the surface side of the semiconductor substrate 11. Therefore, the channel is formed so as to surround the semiconductor substrate 11 on the bottom side of the trench 13 in which the gate electrode 16 is formed. Accordingly, effective channel length can be sufficiently secured and a back bias voltage can be effectively applied to stabilize the transistor characteristic of the DRAM cell which will suffer from a severe short channel effect. Moreover, the take-out electrode 20 can be made connected to the diffusion layer 17 on the entire surface side of the semiconductor substrate 11, with the result that the contact resistance can be decreased.

Furthermore, the word line 16 (16w) is formed so as to connect to the gate electrode 16 in the trench 13 which is formed in the semiconductor substrate 11 and the element separating region 12. Therefore, it is possible to fabricate the word line together with the gate electrode 16 in the same process. Also, the diffusion layer 17 is formed in such a manner that the impurity concentration thereof is decreased as the depth thereof is increased. Thus, it becomes possible to relax the electric field at the junction and the performance of the data holding characteristic can be maintained.

The technology applied to the DRAM region may also be applied to the fabrication of the general-use DRAM memory chip.

As described above, according to the semiconductor device and the method of fabricating the same of the present invention, the impurity concentration of the substrate at the lower portion of the diffusion layer in the DRAM region need not be so high as requested in a cell transistor. Therefore, it becomes possible to relax the junction electric field and to maintain the performance of the data holding characteristic on which more and more demanding requirement is expected upon small-sizing the cell in the DRAM region.

Further, the effective channel length of the cell transistor in the DRAM region can be elongated. Therefore, short channel effect can be suppressed and the characteristic of the transistor can be stabilized.

Further, the entire surface of the diffusion layer in the DRAM region is utilized for contact with the take-out electrode. Thus, the effective area can be advantageously utilized, and it becomes possible to suppress the contact resistance of the diffusion layer to the lowest possible value that can be realized in its cell design.

Furthermore, the take-out electrode of the diffusion layer and the word line (gate electrode) in the DRAM region can be made overlapped with each other in terms of projection design as viewed from the upper side. Thus, microfabrication can be effected on each cell. In the DRAM structure of the current stage, it is necessary to secure a distance of about 20 nm to 30 nm between the word line and the take-out electrode. However, it becomes unnecessary for the DRAM structure of the present invention to secure this distance.

The replacement gate electrode and the DRAM can be fabricated on a single chip so as to realize a high driving power transistor in the logic region. With this arrangement, the gate in the logic region becomes free from care in thermal treatment. Therefore, it becomes possible to utilize zirconium oxide, hafnium oxide, tantalum oxide, aluminum oxide, BST (mixed crystal of $BaTiO_3$ and $SrTiO_3$) and so on for the gate insulating film. Further, it becomes possible to use Cu/TiN, W/TiN or the like for the gate electrode. In this way, the logic elements can be improved in their performance.

The invention claimed is:

1. In a semiconductor device having a memory element and a logic element formed on a same semiconductor substrate, said semiconductor device is characterized in that:

a transistor of the memory element comprises:

a gate electrode formed on a surface side of the semiconductor substrate, and embedded entirely within a trench formed in the semiconductor substrate through a gate insulating film, said pate electrode having a bottom surface facing the semiconductor substrate, and top surface opposite the semiconductor substrate; and a diffusion layer formed on the surface side of the semiconductor substrate at a side wall of the trench, said diffusion layer having a substrate surface at the surface side of the substrate, and a take-out electrode in contact with substantially the entire substrate surface of the diffusion layer, wherein the take-out electrode overlaps the top surface of the gate electrode through an insulating film on the gate electrode.

2. The semiconductor device according to claim 1, characterized in that:

an element separating region is formed on the semiconductor substrate, and a word line is formed so as to connect to the gate electrode provided in the trench which is formed on the semiconductor substrate and the element separating region.

3. The semiconductor device according to claim 1, characterized in that:

an impurity concentration of the diffusion layer is decreased as a depth thereof is increased.

* * * * *